(12) United States Patent
Baumeister et al.

(10) Patent No.: US 6,819,588 B2
(45) Date of Patent: *Nov. 16, 2004

(54) MEMORY ELEMENT, METHOD FOR STRUCTURING A SURFACE, AND STORAGE DEVICE

(75) Inventors: Bettina Baumeister, Würenlingen (CH); Thomas A. Jung, Thalwil (CH); Ernst Meyer, Muttenz (CH); Christoph Walter, Haegendorf (CH); Laura Heyderman, Zofingen (CH)

(73) Assignee: Paul Scherrer Institut (PSI), Villigen (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/299,480

(22) Filed: Nov. 19, 2002

(65) Prior Publication Data

US 2003/0133324 A1 Jul. 17, 2003

Related U.S. Application Data

(63) Continuation-in-part of application No. 09/804,984, filed on Mar. 13, 2001, now Pat. No. 6,515,898.

(51) Int. Cl.$^7$ ............................................. G11C 11/36
(52) U.S. Cl. .................................... 365/174; 365/182
(58) Field of Search ................................. 365/174, 182

(56) References Cited

U.S. PATENT DOCUMENTS

| 4,878,213 A | | 10/1989 | Kazan et al. | |
| 4,956,817 A | * | 9/1990 | West et al. | 365/182 |
| 5,144,581 A | * | 9/1992 | Toda et al. | 365/174 |
| 5,252,835 A | | 10/1993 | Lieber et al. | |
| 5,663,588 A | | 9/1997 | Suzuki et al. | |

OTHER PUBLICATIONS

Patent Abstracts of Japan, Publication No. 54049103, Publication Date: Apr. 18, 1979, Title: Production of Information Recording Carrier.

WO 97/05610, Mass–Storage Applications of Local Probe Arrays, Publication Date: Feb. 13, 1997.

WO 00/09443, Carbon Nanotube Structures Made Using Catalyst Islands, Publication Date: Feb. 24, 2000.

* cited by examiner

*Primary Examiner*—Trong Phan
(74) *Attorney, Agent, or Firm*—Rankin, Hill, Porter & Clark LLP

(57) ABSTRACT

The invention is essentially characterized in that in a first step a substrate is provided, which is coated with defined pattern of protrusions of a coating layer of a different material, so that an interface is defined between the substrate and the coating layer. As an example, the patterned coating layer can be applied by first forming an essentially homogeneous coating layer, which is then partially removed by means of photolithographic and etching techniques, leaving nanometer sized protrusions in that layer. As a next step, the surface provided with these structures is modified by selectively removing protrusions by means of a micro-device. Such a micro-device can be formed in a similar way to a scanning probe microscope (SPM) tip. The presence or absence of a protrusion represents a readable data bit information.

21 Claims, 7 Drawing Sheets

MEMORY ELEMENT, METHOD FOR STRUCTURING A SURFACE, AND STORAGE DEVICE

BACKGROUND OF THE INVENTION

1. Field of the Invention

The invention is in the field of data storage and of micro-mechanical systems. It more particularly relates to a method of structuring a surface, a memory element, a storage medium as data carrier means, a data storage device, and a use of method of structuring a surface.

2. Description of Related Art

Due to increasing miniaturization in many technological fields, including data storage, techniques for applying specific microstructures in the sub-micron or micron range to surfaces become increasingly important. An interesting technology in this context is also the Micro Electro Mechanical Systems (MEMS). Another promising application field concerns the silicon-on-insulator (SOI) technology.

Known techniques for structuring and probing surfaces in the sub-micron region include Scanning Probe Microscopy (SPM), e.g. Atomic Force Microscopy (AFM) or Scanning Tunneling Microscopy (STM). These techniques serve as tools for investigating materials as well as for finding new materials or methods for the application in storage media.

An example of a storage device based on SPM is disclosed in U.S. Pat. No. 5,835,477. A device including arrays of SPMs is described. Perturbations on an essentially flat storage medium surface serve as data bits. Due to the multitude of SPMs, data bits can simultaneously be generated, erased or read. Examples of perturbations serving as data bits include indentations in a soft material as well as locally modified chemical properties, domain structures, crystalline phases, polarization states, and electronic states. All the disclosed perturbations have in common that they are easily disturbed and that they have a rather limited lifetime. Especially, indentations in a wax like medium are relatively quickly smeared out by the mechanical wear of the reading process.

MEMS sensors and actuators become increasingly important. These systems are usually based on a microstructure of silicon and combine mechanical and electrical functions.

SOI (silicon on insulator) technology has recently gained considerable importance. SOI devices comprise a silicon oxide layer and a thin silicon layer on top of it. In this silicon layer, the transistor structure of a chip is formed. Compared to conventional chips built atop a crystalline silicon wafer, the charge-up process when a transistor is switched is done more quickly and efficiently and less power consuming.

When a SOI chip is built, in a first step the silicon-on-oxide structure has to be produced. To this end, two technologies are available: SIMOX (silicon implanted oxide) and bonded SOI. Both technologies have in common the disadvantage that the structure quality and, especially, the interface quality are difficult to control. It would therefore be desirable to have a method and a device that allow testing of the interface quality of a silicon/silicon oxide interface.

SUMMARY OF THE INVENTION

It is an object of the present invention to provide a memory element that produces a reliable information bit with a long lifetime.

It is a further object of the present invention to provide a new method for structuring a surface on a micron or submicron scale that overcomes drawbacks of existing methods and that especially reliably produces a structured surface with information bits with a long lifetime. Preferably, the bits should be readable repeatedly an arbitrary number of times.

It is also an object of the invention to provide a storage medium and a storage device as well as a use for the method of structuring surfaces.

It is a further object of the invention to provide a method for manipulating a surface structure on a submicron or micron scale.

A basic memory element according to the invention is made up of a protrusion on a substrate. The protrusion is such that a predetermined breaking point is present. The protrusion is removed when a pre-defined force is applied onto it. The memory element in this way serves as data bit: the information is given by the fact whether the protrusion is broken off or not.

The invention is based on the insight that an interface a protrusion with a predetermined breaking point can serve as a non-volatile memory element. The protrusion is removed by simply applying a predefined force, such as a lateral force, on the protrusion.

An interface, for example, involving two different materials, can serve as a well defined area of fracture and, thus, as predetermined breaking point. Further preferred predetermined breaking points include breaking points given by a protrusion's geometry, for example its base or constrictions at arbitrary elevations above.

An idea underlying the invention is to make use of the non-volatile character of this information storage. Two examples:

A plurality of basic elements can make up a storage medium. A surface is structured by starting from a first structure, preferably a regular pattern of protrusions, and by selectively removing protrusions by a micro-device. The resulting pattern can be used to code information/data and therefore is an example of an extremely reliable ROM (read only memory) that can not be manipulated.

A basic memory element according to the invention can be combined with a micro electro mechanical sensor. Such a sensor may be formed as a protrusion with a sensor element. The sensor element causes the protrusion to be bent as a function of the quantity to be measured. If the protrusion is at the same time formed to be a memory element according to the invention, the protrusion is broken off if the measured quantity exceeds a certain value. The data bit contains then non-volatile information about the fact if the quantity has once been exceeded. In this way, a concept of "threshold security" is introduced.

The method for structuring a surface is essentially characterized in that in a first step a substrate of a first material is provided, which is coated with a defined pattern of protrusions of a covering layer. As an example, a patterned coating layer can be applied by first forming an essentially homogeneous coating layer, which is then partially removed by means of lithographic and etching techniques, leaving nanometer sized protrusions in that layer. As a next step, the surface provided with these structures is modified by selectively removing protrusions by means of a micro-device. Such a micro-device can be formed in a similar way to a scanning probe microscope (SPM) tip. The presence or absence of a protrusion may represent a readable data bit information.

According to the method for manipulating a surface structure, one starts from a surface with a first structure of protrusions. The protrusions may be placed to form a pattern that is produced, for example, by lithographic techniques. As an alternative, the structure of protrusions may comprise a different, non-periodic structure of protrusions or even consist of a single protrusion. In a next step, protrusions are removed by applying a pre-defined force.

For the method for structuring a surface or for manipulating a surface structure, the pre-defined force may, according to a special embodiment, be actively influenced by a further parameter next to the protrusion size and the interface materials: The surface may be covered by a fluid other than air, e.g. a liquid, even immersed in a fluid. It has been found that the force for removing a protrusion strongly depends on chemical properties of such a fluid. As a trend, fluids with a high electron and proton donating capacity and fluids with small molecules tend to reduce the force for removing protrusions whereas with large, chemically inert molecules the required force is enhanced. This special embodiment, if applied on a storage device, provides an additional degree of freedom for designing a storage device according to particular needs.

A micro-device for removing protrusions can also be used to probe the structured surface and to read data. More generally, data are usually read by probing the topography of the structure produced according to the invention. If the material of the substrate and the protrusions differ from each other in physical or chemical properties, such as their magnetic or electric properties, the surface structure can also be probed using differences in these physical or chemical properties between the protrusions and the other parts of the surface.

In a preferred embodiment of the present invention, silicon is used as a substrate and silicon oxide as the protrusion material. It has surprisingly been found that the $Si/SiO_2$—interface is very well suited for the purpose of forming a predetermined breaking point. The force needed to remove the oxide protrusions is relatively small compared to the force needed to break a pure silicon oxide or silicon structure and very well defined, so that the structuring process can be optimally controlled.

In another preferred embodiment of the present invention, the predetermined breaking point is not an interface but is given by the geometrical shape of the protrusion. For example, the predetermined breaking point may be the base of a column-like protrusion. The protrusion, in this case, may or may not be made of the same material as the substrate.

Also a combination may be envisaged: A protrusion may comprise a first predetermined breaking point given by an interface and a second predetermined breaking point, which is due to its geometrical shape. For example, a column-like protrusion may comprise two proportions, one being of Si and the other one of $SiO_2$, the $Si/SiO_2$ interface being a first predetermined breaking point, and the base of the protrusion being the second predetermined breaking point.

The force needed to remove a protrusion at an interface is different from the force needed to remove the protrusion at the geometrically formed predetermined breaking point. Therefore, by controlling the breaking force at least two information stages can be implemented on a single protrusion.

According to further preferred embodiment, substrate and protrusions are both of the same material, namely of silicon. An ultrathin oxide interface layer then forms the interface. Such an interface layer may, during an etching preparation step, further serve as etch stop. Ultrathin layers of silicon oxide embedded in silicon are nowadays available on the market due to the progress made in the SOI (silicon on insulator) technology.

Of course, any known or yet to be discovered substrate/coating layer material combination can be used, as long as a well-defined interfaces or geometrical shapes are formed. Different materials in the sense of this description also include one material with different additives or dopants or one material in different modifications such as carbon as diamond, graphite, amorphous carbon, etc.

An advantage of a surface or a data storage medium fabricated according to the present invention is that the structure or medium is extremely stable. There are, for example, no volatile materials or electronic or magnetic features that can be easily manipulated. If, for the reading process, a probe similar to an AFM tip or an array of AFM tips is used, the protrusions are essentially not altered at all. The information can thus be read arbitrarily often. If the appropriate materials are chosen, the storage medium according to the invention is thus a well suited medium for WORM (write once read many times) applications. Further, once the information is written on the storage medium, it cannot be altered any more except by removing other protrusions as well, i.e. by destroying the medium. The structure or information is, so to say, "chiseled in stone". The method and storage medium according to the invention is thus extremely well suited for applications where security is a major issue.

For instance, the method and the storage device may be based on an array of micro-devices as disclosed in U.S. Pat. No. 5,835,477. Compared to existing storage devices, a significant improvement with respect to data access rate results.

According to a special embodiment, a pattern of protrusions is provided where each protrusion comprises a plurality of predetermined breaking points. The predetermined breaking points are configured so that, if a force is applied onto the protrusion, breaking off is done at one predetermined breaking point after the other. In this way, a storage medium can be altered to form a WSRM (Write Several times Read Many times) medium.

The structuring method according to the invention further gives rise to progress in investigation methods as well. It allows the investigation, for example by means of SPM probes, of physical or chemical properties of protrusions, such as the mechanical stability, friction erosion, etc. In addition, and possibly even more importantly, this method opens up new possibilities in the field of nanotribology and the studying of interfaces in a submicron range, which is of growing interest, i.e. for micromechanical systems. For example, by systematically measuring forces to be applied to break off a protrusion, a new access to interface adhesive forces and stability as well as interface sharpness is gained.

BRIEF DESCRIPTION OF THE DRAWINGS

In the following, preferred embodiments of the invention are described with reference to drawings. In the drawings, FIG. 1 schematically shows a first example of a one bit memory element in section.

DESCRIPTION OF THE PREFERRED EMBODIMENTS

For the method of storing a data bit, for the memory element, for the method for structuring a surface structuring method and the surfaces structured according to the present invention, various known material handling and manipulating as well as surface probing and manipulating techniques can be used. In the following, preferred embodiments of the present invention and of these techniques are described.

Figure 1:
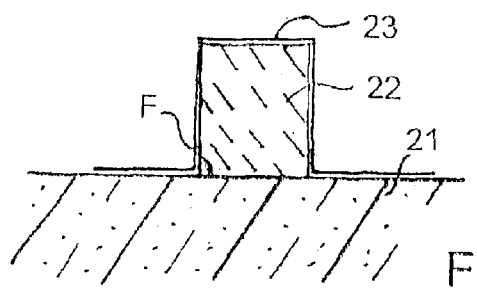

In FIG. 1 a protrusion 22 on a substrate 21 is shown. The basic memory element stores the information bit, whether the protrusion is present or broken off. The two states of an information bit are often referred to as "0" and "1" or as "true" and "false". It goes without saying—as also will further be exemplified below—that any two-state-information can be stored by such a data bit. The protrusion is, for example, formed by a second material, which is different from the (first) substrate material. An interface F forming a predetermined breaking point is formed between the first and the second material. As an example, the first material may be silicon, the second silicon oxide. There are, however, many alternatives for both materials, for example, other semiconductors such as Gallium Arsenide, Germanium Zinc Selenide etc., as well as many insulators including silicon compounds such as Silicon Nitrides etc., but also polymers, any organic material etc. The memory element shown in FIG. 1 further comprises a conductor path 23 between two sides of the protrusion and leading via the protrusion. The presence or absence of the protrusion can thus be determined by measuring the electrical resistance between two contacts contacting each side of the conductor path. The memory element, so to say, forms a bit of a mechanically erasable programmable read only memory.

Figure 2:
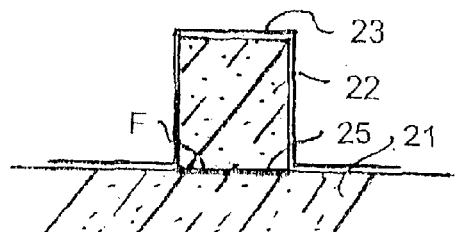
FIG. 2 represents a second example of a one bit memory element in section, FIGS. 3a through 3c schematically show a storage medium comprising a plurality of one bit memory elements during different stages of the patterning step, FIG. 4 very schematically shows a view of the storage medium during the step of selective removal of protrusions.

The memory element shown in FIG. 2 is similar to the one in FIG. 1. However, the substrate and the protrusion material are identical. As an example, they both may be silicon. The interface is formed by an ultrathin interface layer 25 of Silicon Oxide. The interface layer thickness may, for example, be in the range of 1 to 10 atomic layers. Substrates comprising thin silicon oxide layers embedded in silicon are available on the market due to the SOI technology.

Figure 3A:
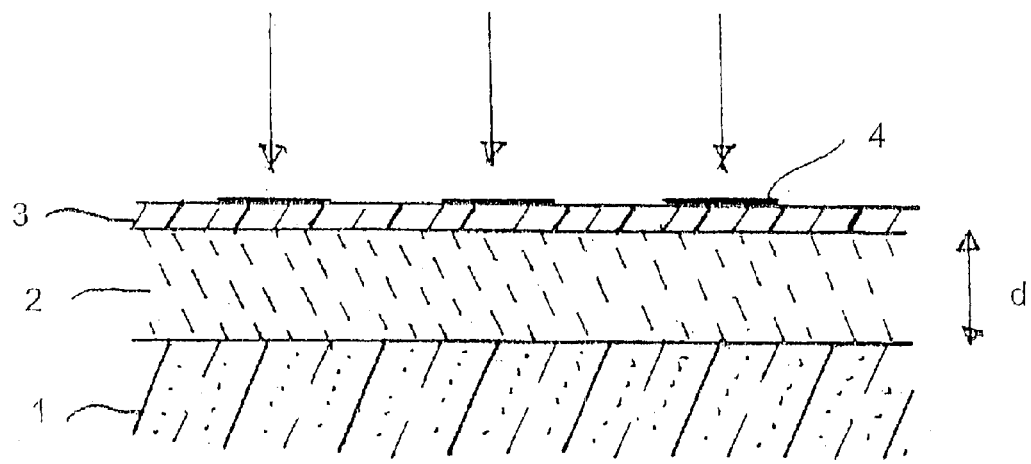
Figure 3B:
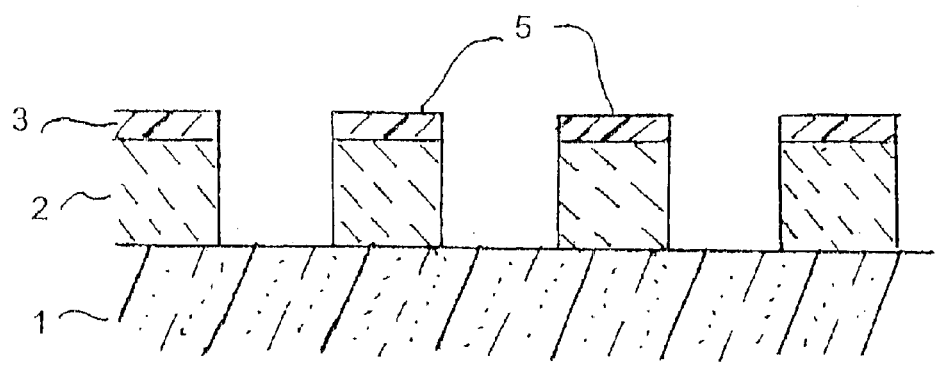
Figure 3C:
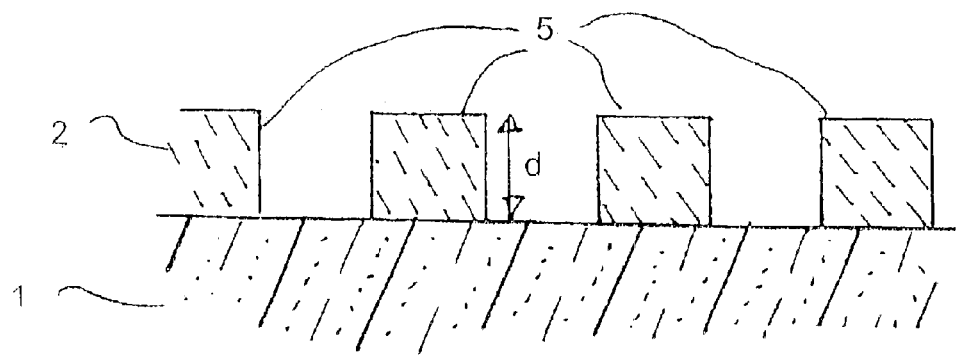

FIGS. 3a-c show the first steps of preparing a storage medium comprising a plurality of memory elements. The storage medium comprises a substrate of a first material coated by a layer of a second material that is distinct from the first material. An interface is formed between the substrate and the layer, which may serve as predetermined breaking point for a controlled removal of protrusions of a predefined pattern. The layer can be applied to the substrate in any known way. The layer can, for example, be grown by deposition, e.g. sputtering, vapor deposition (physical: PVD or chemical: CVD), oxidation, applied by semiconductor or galvanization or electroplating techniques etc. A layer—possibly directly structured or patterned—further can be manufactured by any lithographic technique, by (hot or cold) embossing, by stamping, etc.

On the conventional silicon wafer substrate 1 in FIG. 3a, an oxide layer 2 is grown by oxidizing the silicon. The thickness d of the oxide layer is well defined and lies for instance in a range of d=10–200 nanometers, e.g. around d=120 nm. The techniques to grow an oxide layer of a defined thickness on silicon are well known in the art and can be performed by oxidizing, sputtering, heating, chemical treatment, etc.

To provide the silicon oxide layer 2 with a defined pattern 4, a photoresist layer 3 is applied onto the oxide layer 2. Then, this resist layer is selectively exposed to visible, ultraviolet or possibly infrared light. The exposed spots are either made sensitive or resistant for the following etching process depending on whether a positive or negative photoresist is used. This selective exposing is preferably done by a light interference process: only those parts of the resist layer 3 are exposed where light constructively interferes. The exposing of the resist layer defines the size and shape of the pattern 4. The wavelength of the used light source can be chosen so that a small range patterning of the surface is achieved. If, for instance, a UV light source is chosen, a patterning in the range of only tens of nanometers is attained. In a next step, as shown in FIG. 3b, the photoresist 3 and silicon oxide layer 2 are etched away according to the selective light exposition of the resist layer 3. Protrusions 5 with a height d of about 120 nm and a protrusion to protrusion distance of about 200–400 nm or more are left. After removing the rest of the photoresist 3, the well defined structured surface with a silicon substrate 1 and oxide protrusions 5 in a submicron range is prepared, as can be seen in FIG. 3c. A photoresist layer is applied onto the layer to be patterned.

Using this interference technique, the exposed regions can be made even smaller than the wavelength of the light used for the exposing process. It is, however, also possible to use different lithographic techniques to produce a pattern. Next to all sorts of electromagnetic radiation, such as visible, ultraviolet, and possibly even near infrared light as well as x-rays, also particle radiation may be used to implement a pattern on a resist layer. Examples for such particle radiation comprise electron radiation, ions, neutrons, protons, etc.

Figure 7:
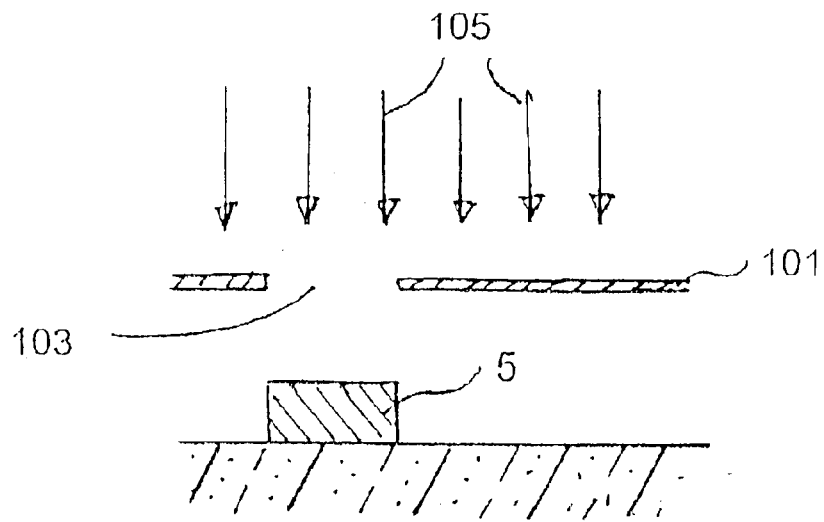
FIG. 7 shows the principle of preparing a pattern or a first structure using a mask, FIGS. 8 and 9 schematically show cross sections of two different protrusions with a plurality of predetermined breaking points.

In the lithographic techniques described above, in a first step an essentially homogeneous, unstructured layer of the second material is applied to the substrate. The layer is then structured in the manner described in one of the following sections. However, it is also possible to directly apply a structured layer to the substrate surface. Any known technique can be used for this, for example, using a mask together with one of (CVD, PVD) MBE (molecular beam epitaxy), of ion beam sputtering, and of spin coating. The principle of preparing a pattern of protrusions using a mask is represented in FIG. 7. A mask 101 has openings 103 through which an ion beam 105 is directed so that protrusions 5 are produced.

Finally, it is also possible to use the same material for substrate and structures, i.e. to fabricate a predefined structured surface in a first step in a homogeneous material. This can, for example, be done by photostructuring and etching. In a second step, the protruding structure material is modified so as to create an interface between the substrate body and the structure. To this end, the substrate may be heated until a phase transition temperature is reached. Another possibility for modifying the structure material is ion implantation into the structure to produce an interface that serves as a weak link or that makes the material sensitive for any following process such as a heating process, as previously mentioned.

The lithographic technique based on light interference necessarily creates a regular pattern starting from which structure may be produced using the method according to the invention. However, if other techniques are applied, any structure serving as a first structure to be manipulated using the method according to the invention can be produced including a non-periodic structure. These other techniques include the above-described mask technique as well as a technique using a mold or any scanning lithographic technique such as a scanning x-ray beam or a scanning electron beam technique.

As to the materials involved, in a preferred embodiment hard materials like silicon and silicon oxide are used. The structure forming an information thereby does not erode or wear away when scanned with any appropriate scanning technique. However, the method of structuring a surface according to the present invention is not restricted to hard materials. It can also be used on any other materials as long as predetermined breaking points can be formed. For example, the use of metals brings about the advantage of an electrically conductive surface. In addition, any combination of insulators, semiconductors, metals, polymers or organic substances that form interfaces as weak links can be used.

Figure 4:
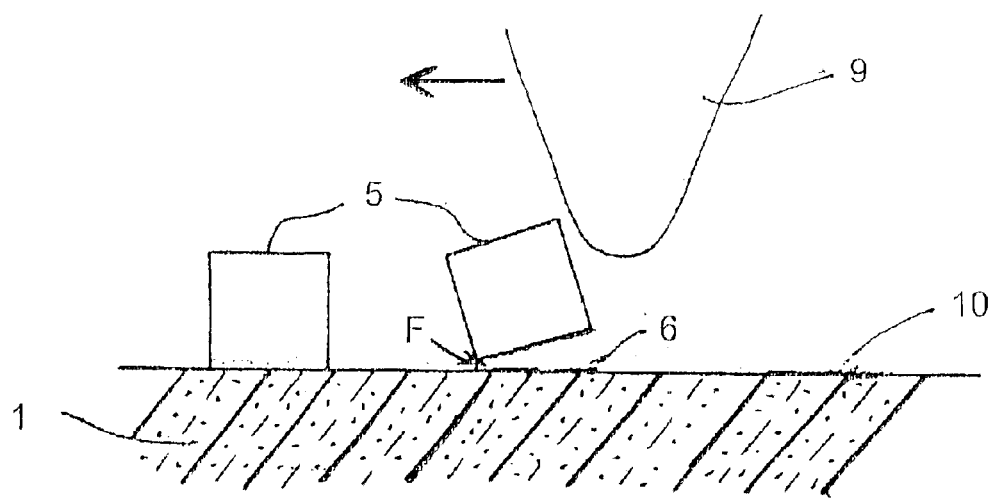

FIG. 4 shows a view of a sample in partial section during the breaking off process. The tip 9 of an atomic force microscope (AFM) is moved along the structured surface in a controlled manner. More general, as examples of microdevices used for probing and structuring a surface conventional scanning probe microscopes (SPM) can be used, such as atomic force microscopes (AFM) or scanning tunneling microscopes, (STM). SPMs are provided with a probing device, such as a cantilever or a tip, for probing a medium surface. SPMs are able to probe and alter a surface in a nanometer range without changing the probing setup. The interaction between tip and sample is measured and, depending on the chosen measuring technique, i.e. AFM or STM, different signals like atomic force, frequency, light deflection, voltage or current, are detected. For the method of the present invention, preferably an AFM or the like is used, an STM being restricted to the use of conductive materials. For probing the surface before and after the structuring according to the invention, also other scanning techniques can be utilized, e.g. optical methods like scanning near field optical microscopy (SNOM) or scanning by a focussed short-wavelength laser beam. This especially holds for the reading process if the structured surface is to be a data storage medium. The applied method is essentially dependent on the materials used and is accordingly optimized. Especially, in a storage device a setup based on AFM technology and comprising an array of cantilevers may be used. Compared to the existing AFM technology, of course, parameters such as resolution, etc., may be adapted to the specific requirements of a storage device and may require less sophistication than a cantilever of an AFM serving for scientific purposes.

Cantilevers and tips as probing devices are well known elements. In principle, a cantilever is a kind of an indication or transfer means: it is flexible up to a certain degree to indicate, for example, the topography or the attractive or repelling forces of a sample sensed by the tip. Cantilevers are preferably fabricated by semiconductor processes, such as wet etching of silicon substrates or other semiconducting materials. Another possibility is to use a bimetal that is bent if a voltage is applied. In that case the deflection of a cantilever is mostly detected by measuring voltage differences. Vice versa: a cantilever can be deflected by applying a voltage. Typical tip materials are, for example, tungsten, iridium, platinum, silicon, diamond, etc. The tip is preferably prepared by wet or dry etching processes that give very sharp tips with tip radii≅50 nm. Sample approach and scanning is typically performed by motors for a coarse approach and piezoelectric means for a fine approach. The scanning of a sample can be done either by moving the sample or the local probe. The scanning is preferably done line by line in an x-y-direction, where a possible movement in z-direction, i.e. perpendicular to the surface, indicates a sample signal.

Returning to the figure, the tip 9 mounted on a cantilever is regulated by the control mechanism in the AFM. It is scanned over the surface in the direction of the arrow such that it exerts a controlled force onto the individual protrusions 5. If the force is high enough the protrusion 5 breaks off at the area of fracture F as predetermined breaking point. The $Si/SiO_2$ interface 6 thereby acts as the weak link. It is observed that the force needed to break off the protrusions 5 is rather well defined and nearly constant for each protrusion of equal dimension. This indicates that the $Si/SiO_2$ interface is also well defined.

After the removal of the protrusion 5 an "empty" region 10 is left, exposing the initial silicon substrate 1, possibly covered with a thin oxide layer. The control mechanism of the AFM allows the selective breaking off or not breaking off of protrusions 5. With this method, a surface can be selectively manipulated to form a structured surface. If the surface is textured with a regular pattern 4 of protrusions 5, the single protrusions 5 can represent information on that surface according to the existence or absence of protrusions 5: each protrusion or missing protrusion represents one data bit. The same tip 9 that is used to create a structured surface can, in principle, also be used as probing tip 9. The data bit information on the surface is, for example, read by scanning over the surface. The information is characterized by the detected signal according to the topography of the surface. The structured surface as described is mechanically and chemically extremely stable. The hard materials, silicon and silicon oxide, do not wear away with a frequent reading process. Silicon also passivates by itself, or can be passivated, with a natural oxide layer of about 20 nm, which is chemically stable.

Figure 5A:
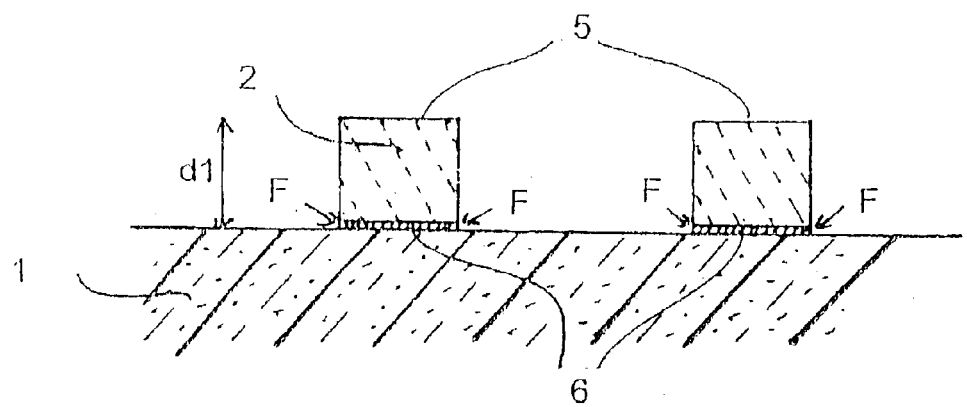
FIGS. 5a and 5b show cross sections of nanostructures with different etching depths, FIG. 6 very schematically shows a perspective view of a part of a structured surface during a data reading process.
Figure 5B:
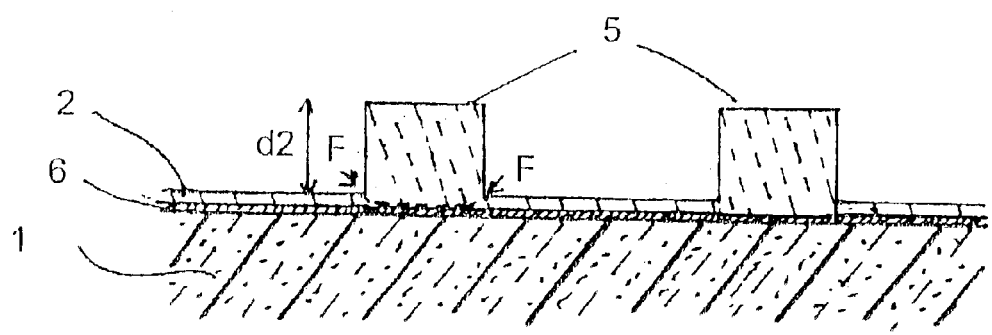

It is observed in experiments that the breaking off of silicon oxide protrusions 5 is very sharp and well defined and not sensitive to the etching depth. In FIGS. 5a and 5b two different etching depths $d_1$ and $d_2$ are shown. In FIG. 5a the oxide layer 2 next to the protrusion 5 is completely etched away leaving the $Si/SiO_2$ interface 6 partially freely accessible. In FIG. 5b this oxide layer 2 is not completely etched away, leaving a small oxide layer on the substrate. The dotted line indicates the predetermined breaking point F. The $Si/SiO_2$ interface 6 is covered by silicon oxide and not as freely accessible, as shown in FIG. 5a. However, the interface is still the "weak link". Experiments show that such differences in etching depths $d_1$, $d_2$ do not prevent or disturb the breaking off process of such nanostructures 5.

Further, it has surprisingly been found that the pre-defined force for breaking off protrusions may actively be influenced by a further parameter next to or in addition to the protrusion size and the interface materials: The surface may be covered by a fluid other than air, e.g. a liquid, even immersed in a fluid. It has been found that the force for breaking off a protrusion strongly depends on chemical properties of such a fluid. As a trend, fluids with a high electron and proton donating capacity and fluids with small molecules tend to reduce the force breaking off protrusions whereas with large, chemically inert molecules the required force is enhanced.

In experiments with $SiO_2$ protrusions with a height of about 120 nm and a diameter of about 400 nm, a threshold value for the pre-defined force has been found to vary between 13 nN water as liquid covering the surface, 25 nN for Hexyl alcohol and more than 70 nN for Silicon oil. This shows that this embodiment of the invention features the advantage that the force for breaking off the protrusions may be actively varied by up to an order of magnitude.

This special embodiment, if applied on a storage device, provides an additional degree of freedom for designing a storage device according to particular needs.

Figure 6:
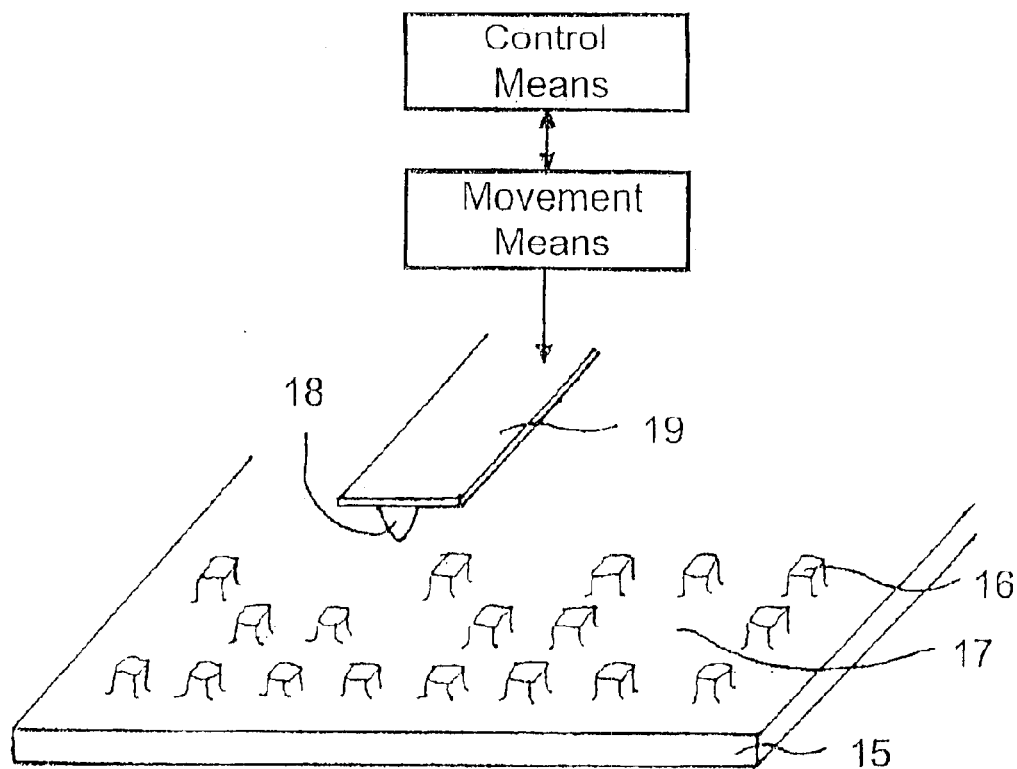

FIG. 6 shows a perspective view of a part of a probing arrangement of a structured surface. A substrate 15 having protrusions 16 and empty spaces 17 where protrusions have been broken off, is probed with a tip 18 of a cantilever 19 both being part of a scanning probe microscope (not shown). Each protrusion 16 or missing protrusion 17 is detected by the SPM tip. The movement, i.e. bending, of the cantilever 19 gives a signal according to the varying topography of the surface. If the structured surface serves a storage medium then the individual protrusions 16 or missing protrusions 17 represent single data bits, i.e. the stored information on that surface.

Figure 8:
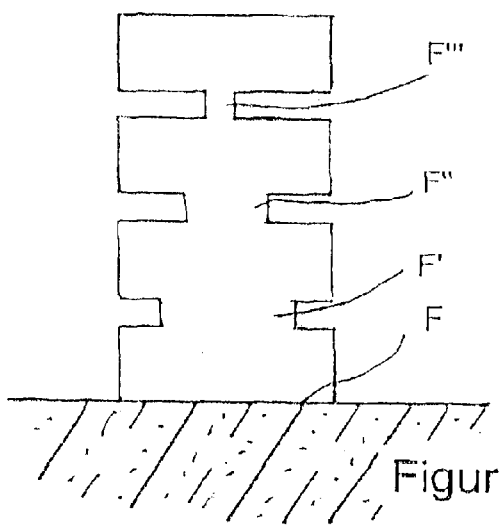
Figure 9:
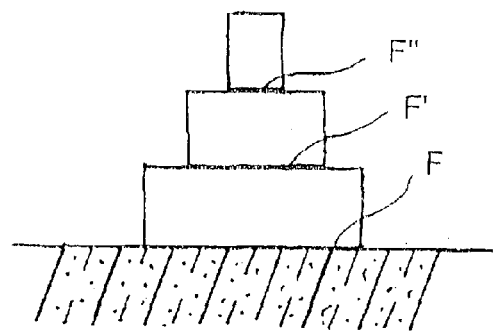

The protrusions shown in FIG. 8 and in FIG. 9 comprise a plurality of predetermined breaking points instead of just one breaking point.

In FIG. 8, the additional predetermined breaking points F', F'' and F''' are caused by circumferential constrictions at different elevations (heights) of the protrusion. These are a first example of predetermined breaking points present due to the protrusion geometry instead of an interface.

In FIG. 9, the additional predetermined breaking points F' and F'' are caused by embedded SOI interface layers in otherwise essentially homogeneous silicon.

Due to the plurality of predetermined breaking points, an example of a WSRM (Write Several Times Read Many Times) storage medium may be formed.

Next to data storage media and devices, the method of structuring a surface can also be used for other applications. These include micro mechanical devices, field emission probes, and actuators. Further, the production of nanostructured masterpieces such as molds for reproducing a structure is possible. The forming of reproduced structures then is done according to the state of the art. For instance, a $Si/SiO_2$ sample, as previously described, can be coated by a very thin metal layer and then reproduction by electroforming can be carried out. One masterpiece produced by the method according to the invention can be used to manufacture a large number of ROM (Read only Memory) storage media.

Figure 10:
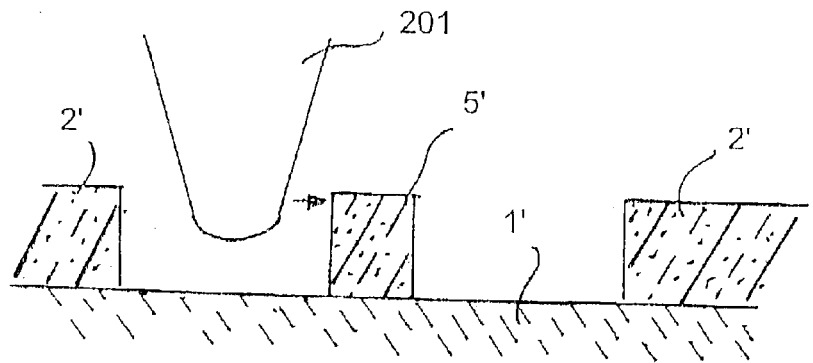
FIG. 10 represents a schematical cross section of the principle of a SOI interface quality testing device.

A further embodiment of the invention relates to SOI technology and is described with reference to FIG. 10. A device for controlling interface quality comprises means for producing a first structure with at least one protrusion 5'. These means for producing a first structure are based on one of the principles previously outlined and are not described in more detail here. The device further comprises a force measuring means 201, schematically illustrated as a cantilever tip. For carrying out a quality test, one starts, for example, from mass produced SOI setup with a silicon oxide substrate 1' and a silicon layer 2' on top of it. The setup is in a first step provided with the structure comprising the protrusion 5'. Then the first structure is manipulated in a way that the protrusion 5' is broken off by the measuring means 201. The thus-measured force is a measure for the interface quality and therefore for the entire SOI structure quality. The force measuring means comprised in the measuring means 201 may determine a force value based on the bending of a cantilever like element. Alternatively, the measuring means may apply a predetermined force. If the protrusion is broken off by this force, the sample fails the quality test, otherwise it passes.

A memory element can also be combined with a MEMS sensor to form a measuring device with a "threshold security" feature. The information bit then comprises the information about whether a quantity—measured by the sensor—has ever exceeded a certain value (threshold value). If it has, the original state of the memory element can only be restored if the entire element is replaced. In this way, manipulation of the memory element is prevented.

The MEMS sensors described in the following are based on the principle a quantity to be measured causes a mechanical deformation of a microstructure, i.e. a bending of a protrusion. All of the following sensors comprise means (not shown in FIGS. 11-15) for determining how much the protrusion has been deformed. Such sensing means are as such known in the art and may comprise a beam deflector, capacitance measuring means, an interferometer, etc.

Figure 11:
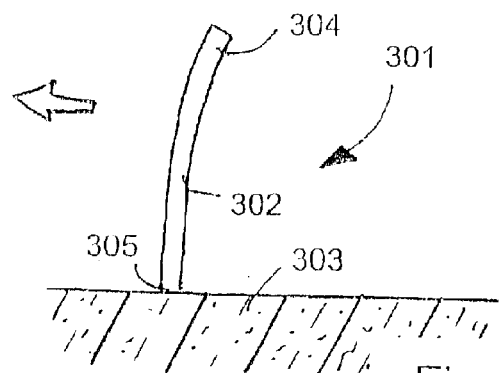
FIGS. 11 through 15 show schematical cross sections of the principle of a MEMS accelerometer, a device for measuring electric fields, a device for measuring magnetic fields, a MEMS thermometer, and a MEMS hygrometer/flow meter, FIG. 16 schematically shows an alternative geometry for one of the above memory elements.

An example of such a method and device is shortly described with reference to FIG. 11. In a very schematic way, a device of measuring accelerations (accelerator) is shown. Such a device can, according to the state of the art, be found in cars or in elevators. Using such a device, the acceleration value is determined. and, from this, it is concluded if an accident has taken place (and e.g. an airbag has to be inflated), or the event of an earthquake is detected.

After an incident, using a possibly damaged device, e.g. a car or an elevator, may be hazardous. The concept of a memory element that stores the information whether a predetermined acceleration value has been exceeded introduces additional security element.

An accelerometer works based on inertia. It comprises a sensor 301 with a flexible portion 302 fixed to a sensor body 303 and a sensing portion 304 fixed to the flexible portion 302. When the sensor body 303 is accelerated, due to the inertia of the sensing portion 304 and the flexible portion 302 and due to the flexibility of the flexible portion, the flexible portion is bent and the sensing portion 304 is displaced with respect to the sensor body 303. This displacement, being a measure of the acceleration, may be determined. The sensor portion 304 may or may not be part of the flexible portion 302. An example of a device for determining forces on a micrometer scale now comprises an interface 305 forming a predetermined breaking point. If the acceleration exceeds a certain threshold value, the flexible portion 302 and/or the sensor body 303 break off at the predetermined breaking point rendering the device unusable. By means of determining the material and dimension parameters, the threshold force—corresponding to the threshold acceleration—can be tuned.

The accelerometer can electronically be coupled to the device, e.g. car or elevator, in which it is placed. As an example, a warning signal informing users about possible hazards can then be produced. As an alternative, the device, e.g. an elevator, may not work at all until service personnel has thoroughly inspected it and replaced the accelerometer. In this way, the embodiment of the method of determining forces introduces the concept of "threshold security".

It goes without saying that the determination of angular velocities is from a certain point of view equivalent to the determination of acceleration and can be done completely analogously to the above acceleration determining procedure. If the radius of the motion of the accelerometer is known, from the centrifugal acceleration the angular velocity may be readily determined.

In the following FIGS. 12 through 15 memory elements coupled with different MEMS sensors are shown. These devices work analogous to the accelerometer with threshold security. Only the origin of the force that causes the protrusion to bend and eventually to break off at the predetermined breaking point varies. The devices of FIGS. 12-15 can all be used to introduce a threshold for a certain quantity, of which a certain value should not be exceeded under normal conditions.

Figure 12:
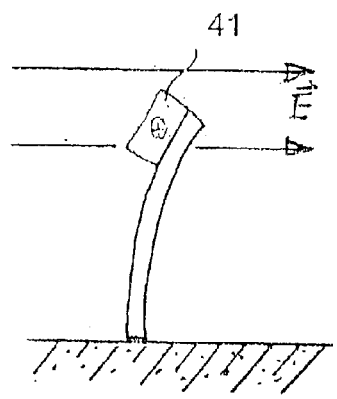
Figure 13:
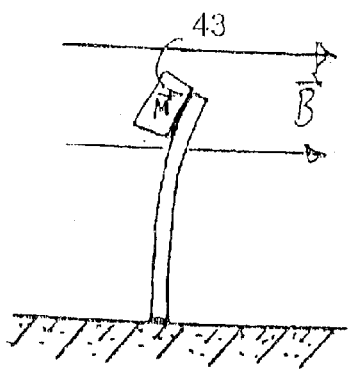

The protrusions of FIGS. 12 and 13 comprise an element 41, 43 upon which a force is exerted when it is subjected to an electric or magnetic field, respectively. This element may be electrically charged (via a conductor path, not shown or due to its chemical composition), or may be a permanent electric or magnetic dipole, respectively.

In the drawings, the sensor elements 41, 43 are shown to be separate elements arranged at the protrusions. However, the elements 41, 43 may also be formed by the protrusions themselves.

Figure 14:
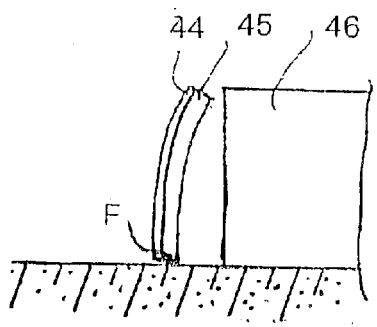

The protrusion of the memory element of FIG. 14 is a bi-metal protrusion having two layers 44, 45 of different materials. If these two materials have differing coefficients of thermal expansion, the device works as thermometer. If the protrusion is heated, it bends. One of the two layers 44, 45 may, however, as an alternative be porous and able to absorb a fluid. The strain in the sensitizing layers and thus the bending of the protrusion is then, for example, dependent on the concentration of a certain substance in the fluid, a chemical composition. In this way, the element of FIG. 14 becomes a chemical sensor (NOSE—technology). The memory element of FIG. 14 further comprises a stop block 46. If the bending of the protrusion exceeds a certain value, it adjoins the stop block 46 and finally breaks off at the interface F.

Figure 15:
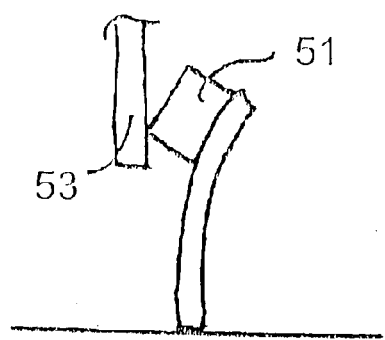

The protrusion of the memory element of FIG. 15 comprises a conjunction element 51 for cooperating with a membrane 53. If pressure is exerted on the membrane—e.g. because of different fluid pressures on either side of the membrane or because of a fluid flow through the membrane or along the membrane—a force is applied on the protrusion. If this force exceeds a certain value, the protrusion breaks off.

Figure 16:
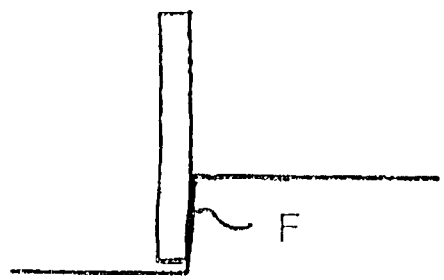

Of course, the above concepts are not restricted to the described examples. In particular, next to different materials, measuring methods, manufacturing methods, etc, also different geometries are possible. An example of a different geometry is shown in FIG. 16, where the interface F is placed laterally.

Figure 17:
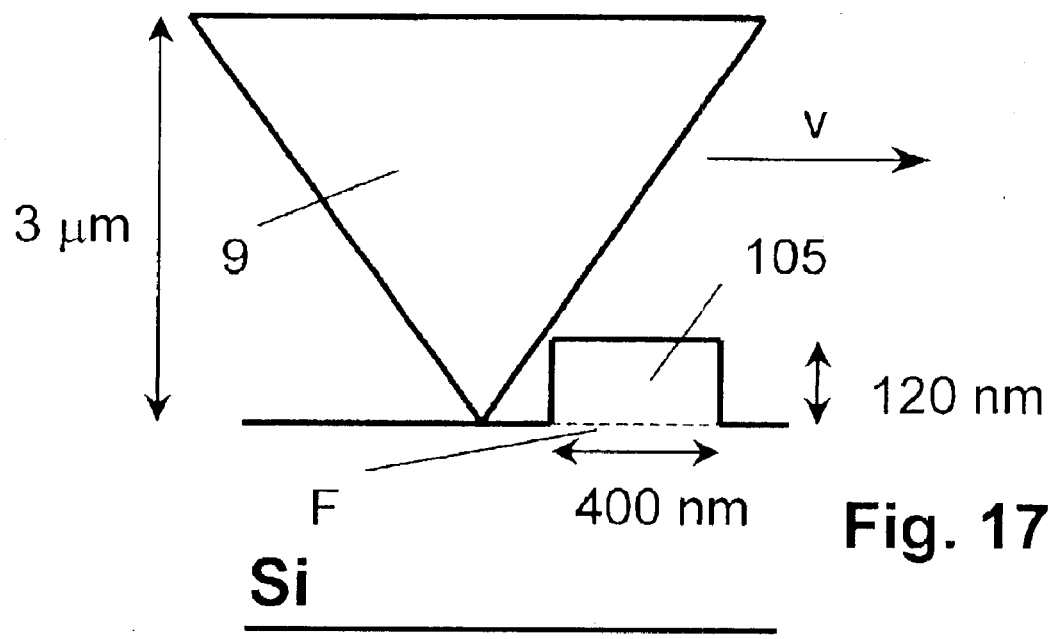
FIGS. 17 and 18 show further embodiments of memory elements.

FIG. 17 shows, after FIG. 8, another example of a memory element where the substrate and the protrusion are both made of the same material (Si in the shown example). Experiments reveal that also in this case geometry defines a predetermined breaking point, thus making the method of writing/reading an information bit according to the invention reproducible. The predetermined breaking point F of the column-like protrusion 105 shown in the Figure is the base of the column. The column breaks away upon application if a pre-determined force.

Figure 18:
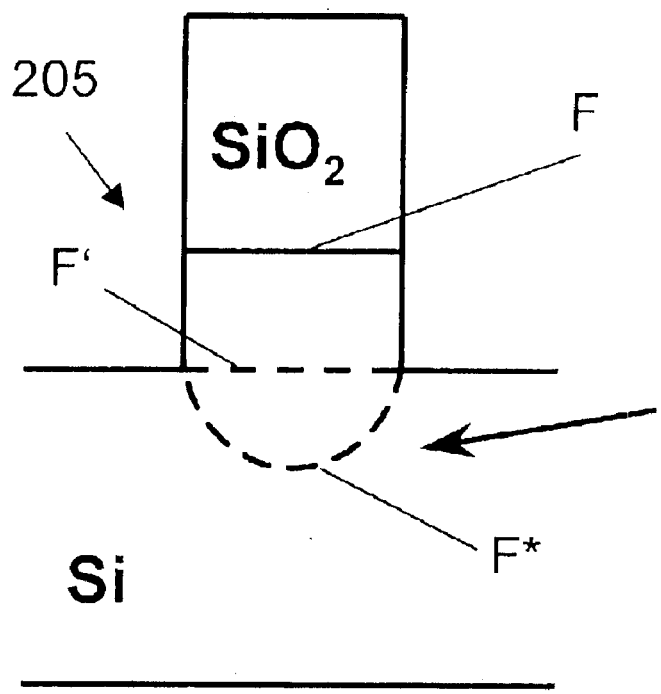

FIG. 18 shows an example of a combination of the two principles of defining a predetermined breaking point F, namely of the interface defined predetermined breaking point and of the geometrical shape defined predetermined breaking point F'. A column like protrusion 205 comprises a lower part of the substrate material (in the context of this application called "first material", Si in the shown example) and an upper part of a second material (silicon dioxide in the shown example). The interface between the two materials defines a first predetermined breaking point F, whereas the base of the protrusion defines a second predetermined breaking point F'. Depending on the strength and kind of force applied—as controlled by control means of the micro device—the protrusion breaks off either at the first or at the second predetermined breaking point. Therefore, the memory element instead of providing an information bit of a binary system may be viewed as providing an information bit of a ternary system—the protrusion may either be intact or broken off or partially broken off.

F* in the figure denotes a possible further predetermined breaking point which may be present under certain conditions, the line of fracture corresponding to a crater fracture.

In the following, possibilities of imaging and of removing protrusions are shortly discussed as preliminary examples.

Imaging mode: an atomic force microscope like atomic force scanning probe tip is applied to the surface in a contact mode with a small scanning force (force applied in the direction perpendicular to the surface). In the shown examples with the mentioned materials, the scanning force may, for example, be between 0.1 and 6 nN, typically 4 nN.

Static modification mode: If an increased scanning force is applied, the protrusions may be removed by scanning over them. The scanning force in the shown examples may, for example, be between 8 nN and 1000 nN, typically between 8 nN and 70 nN.

Dynamic modification mode: increased scanning force of—in the shown examples—typically 8 nN and oscillations (for example around 1.75 kHz, 25 nm). In this mode the protrusion may be removed by an erosive process rather than by a breaking process. However, the "predetermined breaking point" (in this case corresponding the remaining surface once the protrusion is removed) is still well defined.

Numerous other embodiments may be envisaged, without departing from the spirit and scope of the invention.

What is claimed is:

1. A method for storing an information bit comprising the steps of:
    providing a substrate, said substrate comprising a protrusion; and,
    depending on whether the information bit is "0" or "1", removing or not removing said protrusion, by applying a pre-defined force.

2. The method as claimed in claim 1, wherein a joint face is defined between said protrusion and said substrate, said joint face being a boundary layer between two different materials, said joint face serving as a predetermined breaking point.

3. The method as claimed in claim 2, wherein at least one of said two different materials comprises silicon.

4. The method as claimed in claim 1, wherein a predetermined breaking point between said substrate and said protrusion is defined by a geometrical shape of said protrusion.

5. The method as claimed in claim 4, wherein said protrusion is column shaped, and wherein said predetermined breaking point is formed at a base of said protrusion.

6. A memory element comprising:
- a substrate, said substrate comprising a protrusion, said protrusion being removable by the application of a predetermined force on the protrusion; and
- means for determining whether said protrusion has been removed and for determining an information bit to be "1" or "0" depending on whether said protrusion has been removed.

7. The memory element as claimed in claim 6, wherein said means for determining whether said protrusion has been broken off comprise a conductor path on said protrusion which is interrupted when the protrusion is broken off.

8. The memory element as claimed in claim 6, wherein said means for determining whether said protrusion has been broken off comprise an atomic force probe tip.

9. The memory element as claimed in claim 8, further comprising control means for controlling said atomic force probe tip so as to function in a protrusion removing mode, wherein said atomic force probe tip serves as a means for applying said pre-determined force for removing said protrusion.

10. The memory element as claimed in claim 6, wherein said substrate is made of a first material, wherein said protrusion is made of a second material, and wherein one of said first and said second materials is silicon and the other of said first and of said second materials is silicon oxide.

11. The memory element as claimed in claim 6, wherein a predetermined breaking point between said substrate and said protrusion is defined by a geometrical shape of said protrusion.

12. The memory element as claimed in claim 11, wherein said protrusion is column shaped, and wherein said predetermined breaking point is formed at a base of said protrusion.

13. The memory element as claimed in claim 6, wherein an interface is formed between said substrate and said protrusion, said substrate being an ultrathin silicon oxide layer embedded between a first material layer, which is silicon, and a second material layer, which is silicon.

14. The memory element as claimed in claim 6, wherein said protrusion is a micro electro mechanical sensor and wherein said information bit comprises information about whether a measurable quantity has exceeded a certain value.

15. The memory element as claimed in claim 14, wherein said protrusion comprises one of a chargeable conductor element and a ferroelectric element so that the protrusion is bent when exposed to an electric field.

16. The memory element as claimed in claim 14, wherein said protrusion comprises a ferromagnetic element so that the protrusion is bent when exposed to a magnetic field.

17. The memory element as claimed in claim 14, wherein said protrusion comprises a mass element so that the protrusion is bent when accelerated or when subjected to a circular motion.

18. The memory element as claimed in claim 14, wherein said protrusion comprises a bi-metal element so that the protrusion is bent when subjected to a temperature change.

19. The memory element as claimed in claim 14, wherein said protrusion comprises a conjunction element for working with a membrane such that said protrusion is bent when said membrane is subjected to pressure or when said membrane is subjected to a fluid flow therethrough.

20. A write once read many times (WORM) data storage medium comprising:
- a substrate;
- a defined structure of protrusions on a surface of said substrate, the structure being fabricated by selectively removing protrusions of a regular pattern of protrusions,
- each removed or not removed protrusion forming a memory element storing one data bit; and,
- means for determining whether a protrusion has been removed.

21. The data storage medium as claimed in claim 20, wherein said substrate is made of silicon and said protrusions are made of silicon oxide.

* * * * *